United States Patent
Kim et al.

(10) Patent No.: US 9,960,798 B2
(45) Date of Patent: May 1, 2018

(54) APPARATUS AND METHOD FOR TUNING FREQUENCY

(71) Applicant: Samsung Electronics Co., Ltd., Suwon-si (KR)

(72) Inventors: SeongJoong Kim, Hwaseong-si (KR); Joonseong Kang, Suwon-si (KR); Seok Ju Yun, Hwaseong-si (KR); Young Jun Hong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/214,784

(22) Filed: Jul. 20, 2016

(65) Prior Publication Data

US 2017/0201281 A1    Jul. 13, 2017

(30) Foreign Application Priority Data

Jan. 7, 2016 (KR) .................. 10-2016-0001964

(51) Int. Cl.
*H04B 1/16* (2006.01)
*H03L 7/099* (2006.01)
*H04B 1/10* (2006.01)

(52) U.S. Cl.
CPC .............. *H04B 1/16* (2013.01); *H03L 7/0991* (2013.01); *H04B 1/1027* (2013.01); *H04B 2001/1072* (2013.01)

(58) Field of Classification Search
CPC ........ H03J 2200/10; H03L 7/099; H03B 5/08; H03B 5/1265; H04B 1/7183; H04B 7/0811; H04L 27/06
See application file for complete search history.

(56) References Cited

U.S. PATENT DOCUMENTS

| 7,773,962 B2 | 8/2010 | Sutskover et al. |
| 8,913,648 B2 | 12/2014 | Kang et al. |
| 2014/0253255 A1* | 9/2014 | Chan ............ H03L 7/099 331/36 C |
| 2016/0072463 A1* | 3/2016 | Camilleri ........ H03G 1/0035 361/281 |

FOREIGN PATENT DOCUMENTS

| JP | 10-256928 A | 9/1998 |
| JP | 2001-86176 A | 3/2001 |
| JP | 2009-194778 A | 8/2009 |

(Continued)

OTHER PUBLICATIONS

J-Y Chen, et al., "A Fully Integrated Auto-Calibrated Super-Regenerative in 0.13-µm CMOS," *IEEE Journal of Solid-State Circuits*, vol. 42, No. 9, Sep. 2007, pp. 1976-1985.

(Continued)

*Primary Examiner* — David S Huang
(74) *Attorney, Agent, or Firm* — NSIP Law

(57) ABSTRACT

A frequency tuning apparatus includes: a frequency tuner configured to tune an oscillation frequency of an oscillator based on target information extracted from a mapping table in correspondence to a target frequency, and oscillation information collected from the oscillator; and a frequency compensator configured to compensate for a compensation error between the tuned oscillation frequency and the target frequency based on an offset table.

24 Claims, 17 Drawing Sheets

(56) References Cited

FOREIGN PATENT DOCUMENTS

| | | |
|---|---|---|
| JP | 2012-199761 A | 10/2012 |
| KR | 10-2015-0004977 A | 1/2015 |
| KR | 10-2015-0086838 A | 7/2015 |

OTHER PUBLICATIONS

J. L. Bohorquez, et al., "A 350 µW CMOS MSK Transmitter and 400 µW OOK Super-Regenerative Receiver for Medical Implant Communications," *IEEE Journal of Solid-State Circuits*, vol. 44, No. 4, Apr. 2009, pp. 1248-1259.

M. Vidojkovic, et al., "A 2.4GHz ULP OOK Single-Chip Transceiver for Healthcare Applications," *IEEE International Solid-State Circuits Conference*, ISSCC 2011, Session 26, Feb. 2011, pp. 458-460.

\* cited by examiner

1100

APPARATUS AND METHOD FOR TUNING FREQUENCY

CROSS-REFERENCE TO RELATED APPLICATIONS

This application claims the benefit under 35 USC 119(a) of Korean Patent Application No. 10-2016-0001964 filed on Jan. 7, 2016, in the Korean Intellectual Property Office, the entire disclosure of which is incorporated herein by reference for all purposes.

BACKGROUND

1. Field

The following description relates to an apparatus and method for tuning, for example, correcting a frequency.

2. Description of Related Art

A super regenerative receiver (SRR) is known as a low cost, easily configurable receiver having an appropriate reception sensitivity. SRRs have been widely applied to a variety of fields, such as the fields of remote control toys, information systems, and monitoring devices.

An SRR detects a signal based on a signal magnitude and a startup time of an oscillator in a circumstance in which an input signal is present. The signal magnitude and the startup time of the oscillator are based on a power and a frequency of a signal received at an antenna and a resonant frequency of the oscillator. When an input signal is absent, the SRR may oscillate very slowly due to thermal noise according to a magnitude of direct current (DC) bias set in the oscillator.

Since a super regenerative receiver (SRR) performs periodic quenching, a magnitude of bias current of an oscillator periodically varies during an operation of the SRR. Accordingly, an existing phase locked loop (PLL) scheme may not continuously control a frequency of the oscillator during the operation of the SRR.

Due to the above characteristic of the SRR, a method of calibrating a super regenerative oscillator (SRO) using a PLL before receiving data and turning off the PLL during the operation of the SRR may be employed. However, in the above method, leakage current occurs at a charge pump node during the operation of the SRR and, thus, a frequency of the SRO may drift.

A frequency control loop (FCL) is advantageous in a low power design compared to the existing PLL and a frequency drift may not occur during the operation of the SRR. However, a frequency offset may occur between an oscillation frequency of then SRO by the FCL in a calibration mode and an average resonant frequency of the SRR when receiving actual data. The frequency offset may degrade the performance of a bit error rate (BER) of the SRR.

Accordingly, there is a need for frequency synthesis technology for aligning an oscillation frequency of an SRO that is in low power and in a periodic quenching mode, and an actual frequency of data received via an antenna.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a frequency tuning apparatus includes: a frequency tuner configured to tune an oscillation frequency of an oscillator based on target information extracted from a mapping table in correspondence to a target frequency, and oscillation information collected from the oscillator; and a frequency compensator configured to compensate for a compensation error between the tuned oscillation frequency and the target frequency based on an offset table.

The frequency compensator may be further configured to compensate for a capacitance of the oscillator based on a compensation signal extracted from the offset table in correspondence to the target frequency.

The oscillator may include a capacitor having a capacitance configured to be tuned. The frequency tuner may be further configured to control a portion of the capacitor in response to a control signal for controlling the capacitor. The frequency compensator may be further configured to control a remaining portion of the capacitor in response to a compensation signal extracted from the offset table in correspondence to the target frequency.

The frequency compensator may be further configured to compensate for a control signal for controlling a capacitor of the oscillator based on a compensation signal extracted from the offset table in correspondence to the target frequency.

The oscillator may include a capacitor having a capacitance configured to be tuned based on a digital code of a control signal. The frequency compensator may be further configured to change the digital code of the control signal based on a compensation signal extracted from the offset table in correspondence to the target frequency.

In the offset table, compensation signals for compensating for compensation errors occurring with respect to corresponding target frequencies may be mapped to the corresponding target frequencies.

In the mapping table, information about a number of oscillations of corresponding target frequencies during a mask time may be mapped to the corresponding target frequencies.

The frequency tuner may include: a first tuning controller configured to coarsely tune the oscillation frequency of the oscillator based on a result of comparing the target information to the oscillation information; and a second tuning controller configured to finely tune the oscillation frequency of the oscillator based on a result of comparing the target information to the oscillation information.

The oscillator may be configured to oscillate at an oscillation frequency in which the compensation error is compensated for.

In another general aspect, a super regenerative receiver includes: a super regenerative oscillator configured to oscillate in response to a received external signal; and a frequency tuning apparatus configured to tune an oscillation frequency of the super regenerative oscillator based on oscillation information collected from the super regenerative oscillator, and target information extracted from a mapping table and corresponding to a target frequency, and compensate for a compensation error between the tuned oscillation frequency and the target frequency based on an offset table.

The frequency tuning apparatus may include: a frequency tuner configured to tune the oscillation frequency of the super regenerative oscillator; and a frequency compensator configured to compensate for the compensation error between the tuned oscillation frequency and the target frequency.

The super regenerative receiver may be configured to activate the frequency tuner before receiving a data packet, and to inactivate at least a portion of the frequency tuner during receiving the data packet.

In the offset table, compensation signals for compensating for compensation errors occurring with respect to corresponding target frequencies may be mapped to the corresponding target frequencies.

The super regenerative receiver may further include: an isolator configured to electrically isolate the super regenerative oscillator from an antenna for receiving the external signal, receive the external signal from the antenna, and transfer the external signal to the super regenerative oscillator; and an envelope detector configured to detect an envelope from an oscillation signal of the super regenerative oscillator.

The frequency tuning apparatus may be further configured to compensate for a capacitance of the super regenerative oscillator based on a compensation signal extracted from the offset table in correspondence to the target frequency.

The super regenerative oscillator may include a capacitor having a capacitance configured to be tuned. The frequency tuning apparatus may be further configured to control a portion of the capacitor in response to a control signal, and control a remaining portion of the capacitor in response to a compensation signal extracted from the offset table in correspondence to the target frequency.

The frequency tuning apparatus may be further configured to compensate for a control signal based on a compensation signal extracted from the offset table in correspondence to the target frequency.

The super regenerative oscillator may include a capacitor having a capacitance configured to be tuned based on a digital code of a control signal. The frequency tuning apparatus may be further configured to change the digital code of the control signal based on a compensation signal extracted from the offset table in correspondence to the target frequency.

The frequency tuning apparatus may be further configured to: determine, as the compensation error, a difference between an oscillation frequency of the super regenerative oscillator during a period of time in which bias current injected to the super regenerative oscillator is constant before receiving a data packet and an oscillation frequency of the super regenerative oscillator during a period of time in which current of a quench waveform is injected, with respect to the target frequency; and map a compensation signal for compensating for the compensation error to the target frequency and to store the mapped compensation signal in the offset table.

The super regenerative receiver may be further configured to: oscillate the super regenerative oscillator in response to a transmission signal of the target frequency, to determine, as a target capacitance, a capacitance that maximizes an output of an envelope detector with changing a capacitance of the super regenerative oscillator; map, to the target frequency, an offset capacitance that is a difference between the target capacitance and a capacitance during a period of time in which bias current injected to the super regenerative oscillator is constant before receiving a data packet at the target frequency; and store the mapped offset capacitance in the offset table.

The transmission signal may be a signal received from an external transmitter.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
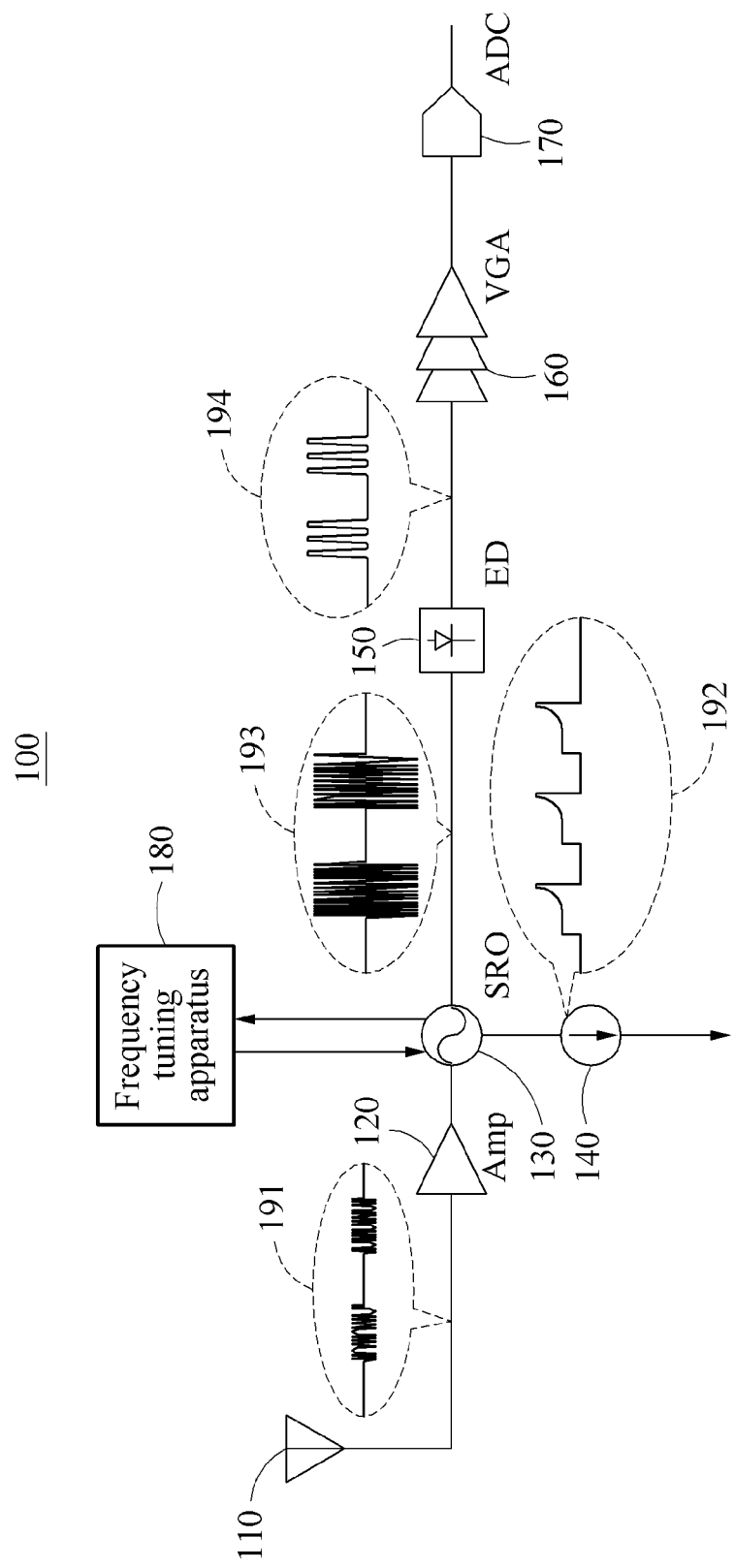
FIG. 1 illustrates an example of a signal reception apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terminology used herein is for the purpose of describing particular examples only, and is not to limit the disclosure. As used herein, the singular forms "a", "an", and "the" are intended to include the plural forms as well, unless the context clearly indicates otherwise.

Also, when describing examples by referring to the accompanying drawings, like reference numerals are assigned to like elements throughout and repeated description related thereto will be omitted. When detailed description related to the known art is determined to make the embodiments unnecessarily ambiguous, the detailed description will be omitted.

FIG. 1 illustrates an example of a signal reception apparatus 100. Referring to FIG. 1, the signal reception apparatus 100 is configured to receive and transfer a signal 191 from an outside, and includes, for example, an antenna 110, an amplifier 120, an oscillator 130, a current source 140, an envelope detector 150, a voltage gain amplifier 160, an analog-to-digital converter (ADC) 170, and a frequency tuning apparatus 180.

The antenna 110 receives the signal 191 from the outside (e.g., from an external or remote device). For example, the signal 191 may be a signal of a preset frequency band.

The amplifier 120 amplifies the received signal 191. The amplifier 120 may also be referred to as an isolator. The isolator 120 electrically isolates the antenna 110 from the oscillator 130, receives the signal 191 from the antenna 110 and transfers the signal 191 to the oscillator 130.

The oscillator 130 oscillates to receive the signal 191. For example, the oscillator 130 may oscillate at an oscillation frequency. The oscillation frequency, which is a frequency at which the oscillator 130 oscillates, may be determined using a resonant frequency determined by a combination of a capacitor and an inductor included in the oscillator 130. Also, the oscillator 130 outputs an oscillation signal 193 having the oscillation frequency. In one example, the oscillator 130 oscillates in response to the signal 191 received via the antenna 110. In a case in which the oscillator 130 oscillates in response to the signal 191 received from the outside, the oscillator operates as a super regenerative SRO and thus, is also referred to as the SRO 130. The signal reception apparatus 100 including the SRO 130 may be referred to as an SRR.

The oscillator 130 oscillates in response to the signal 191 received from the outside, based on injection current in a quench waveform. The current source 140 injects current 192 to the oscillator 130. The current source 140 oscillates the oscillator 130 by injecting sufficient current to the oscillator 130. Once the current source 140 injects a threshold current (e.g. a current at or above a threshold amount of current) to the oscillator 130, the oscillator 130 may start to oscillate in response to the signal 191 received via the antenna 110. Also, the current source 140 provides the current 192 in a quench waveform to the oscillator 130.

The envelope detector 150 detects an envelope 194 of the oscillation signal 193 output from the oscillator 130. The voltage gain amplifier 160 amplifies the envelope 194 output from the envelope detector 150. The ADC 170 converts the amplified envelope 194 from an analog signal to a digital signal.

The frequency tuning apparatus 180 tunes a frequency of the oscillator 130 to a target frequency. The target frequency is a desired frequency at which the oscillator 130 is to operate and may be set to be similar to or the same as a frequency of the received signal 191. Hereinafter, an operation of the frequency tuning apparatus 180 will be described.

Figure 2:
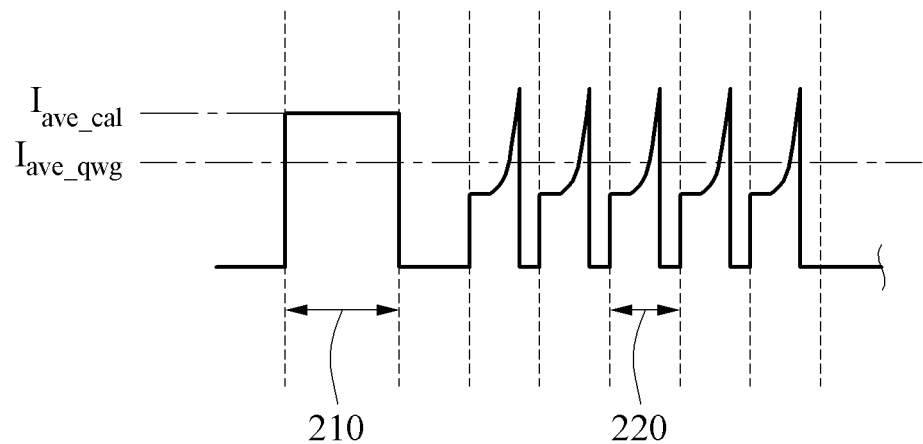
FIG. 2 illustrates an example of current injected to an oscillator.

FIG. 2 illustrates an example of current injected to an oscillator. Referring to FIG. 2, current 200 may be injected to the oscillator in a different form for each mode among a plurality of modes. For example, the oscillator operates in a calibration mode 210 and a reception mode 220. The calibration mode 210 is a mode in which a signal reception apparatus, for example, an SRR, presets a frequency of the oscillator to a frequency, for example, a target frequency, of a received signal before receiving data. The reception mode 220 is a mode in which the oscillator operates at the target frequency and the signal reception apparatus receives a signal including data. In response to matching an oscillation frequency of the oscillator to the target frequency in the calibration mode 210, the signal reception apparatus receives data by repeating the reception mode 220. A current-off section in which current injected to the oscillator is off may be present between the reception modes 220. The reception mode 220 may correspond to a single symbol.

In the calibration mode 210, a current source injects static current to the oscillator. For example, the static current is current having a constant value. The average static current may be $I_{ave\_cal}$, which is an amount of current sufficient to oscillate the oscillator.

In the reception mode 220, the current source injects injection current in a quench waveform. Although FIG. 2 illustrates the quench waveform in a shape similar to an exponential curve, it is only an example. The quench waveform may be configured in a variety of shapes. An average value $I_{ave\_qwg}$ of the quench waveform is an amount of threshold current used to oscillate the oscillator.

Each mode includes a section in which an operation of a frequency tuner is off, for example, a section in which injection current is zero. The oscillator performs periodic quenching, which may lead to failing in continuously tracking a frequency. Accordingly, a frequency drift may occur. Due to the frequency drift, a compensation error occurs as an offset frequency between the oscillation frequency of the oscillator of the signal reception apparatus and a desired target frequency. In this example, the BER performance may be degraded. Thus, the signal reception apparatus compensates for the compensation error through a frequency compensator.

FIGS. 3 through 6 are graphs showing examples of a principle of a frequency tuning apparatus.

Figure 3:
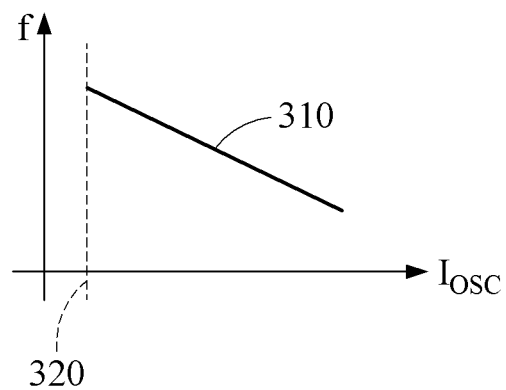
FIGS. 3 through 6 are graphs showing examples of a principle of a frequency tuning apparatus.

FIG. 3 is a graph showing an oscillation frequency 310 based on injection current $I_{OSC}$ injected to an oscillator. Referring to FIG. 3, the oscillation frequency 310 decreases according to an increase in the injection current $I_{OSC}$. Here, the oscillator oscillates when the injection current $I_{OSC}$ reaches or exceeds the threshold current 320.

Figure 4:
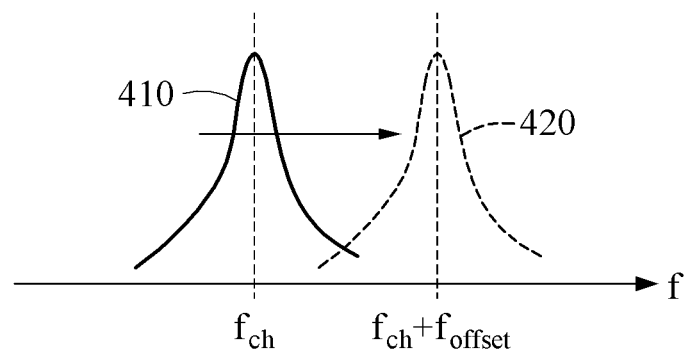

A frequency drift occurs based on a magnitude of the injection current. Referring to FIG. 4, a selectivity center frequency of a signal reception apparatus, for example, an SRR, decreases according to an increase in the average injection current. For example, as described above with FIG. 2, the average current $I_{ave\_qwg}$ in a reception mode is lower than the average current $I_{ave\_cal}$ in a calibration mode. In the calibration mode, a frequency spectrum 410 of the calibration mode is generated based on a target frequency $f_{ch}$ with respect to a selected oscillation frequency of an oscillator. In contrast, in the reception mode, a frequency spectrum 420 of the reception mode is generated by applying an offset frequency $f_{offset}$ to the target frequency $f_{ch}$ due to the frequency drift.

Figure 5:
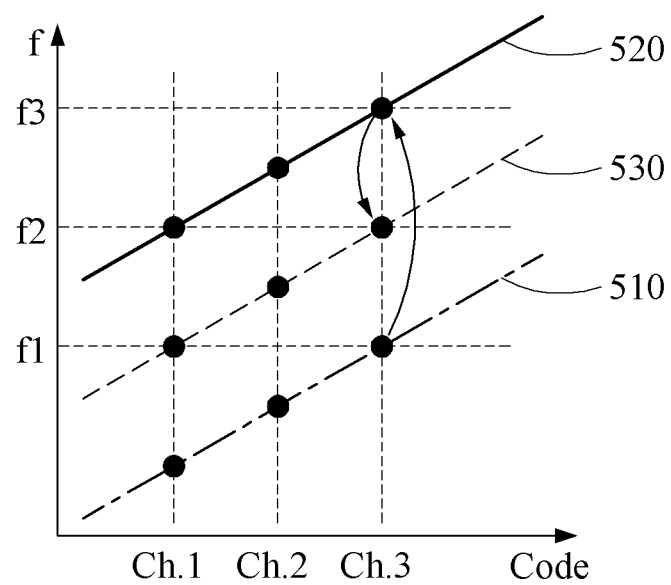

In this regard, referring to FIG. 5, the horizontal axis denotes a setting about each frequency of the oscillator, for example, a capacitor code for designating a capacitance, and the vertical axis denotes an oscillation frequency according to a capacitor code designated for each frequency. Although FIG. 5 illustrates three frequencies as an example, the number of frequencies is not limited thereto. For example, in the calibration mode, the oscillator oscillates at a frequency f1 510 based on a capacitor code designated for a number 3 frequency. However, when the oscillator operates at the same capacitance and enters into the reception mode, a frequency drift that causes the oscillator to operate at a higher frequency, for example, a frequency f3 520, may occur. The signal reception apparatus tunes a frequency of the oscillator to a target frequency, for example, a frequency f2 530 by compensating for the capacitance of the oscillator.

Figure 6:
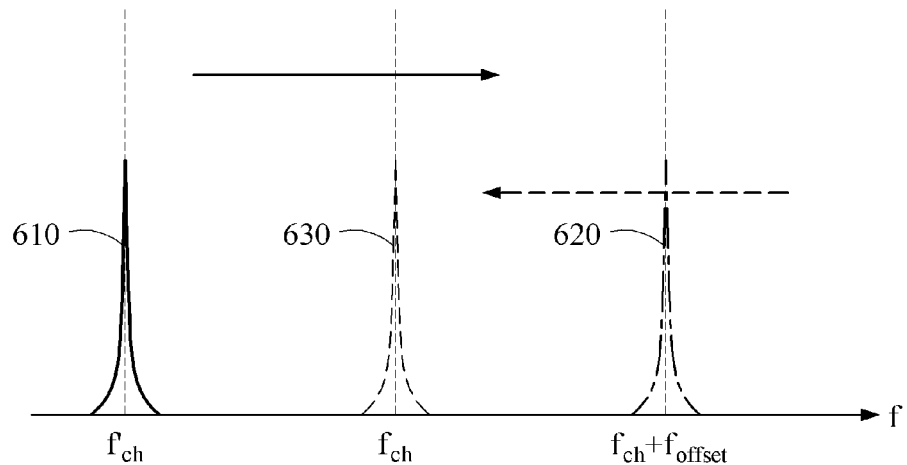

For example, referring to FIG. 6, the oscillator tuned to oscillate at a specific frequency $f_{ch}$ 610 in the calibration mode oscillates at a frequency $f_{ch}+f_{offset}$ 620 to which an offset is applied in an actual reception mode. The frequency tuning apparatus may operate the oscillator at a target frequency $f_{ch}$ 630 by controlling the capacitance of the oscillator.

Figure 7:
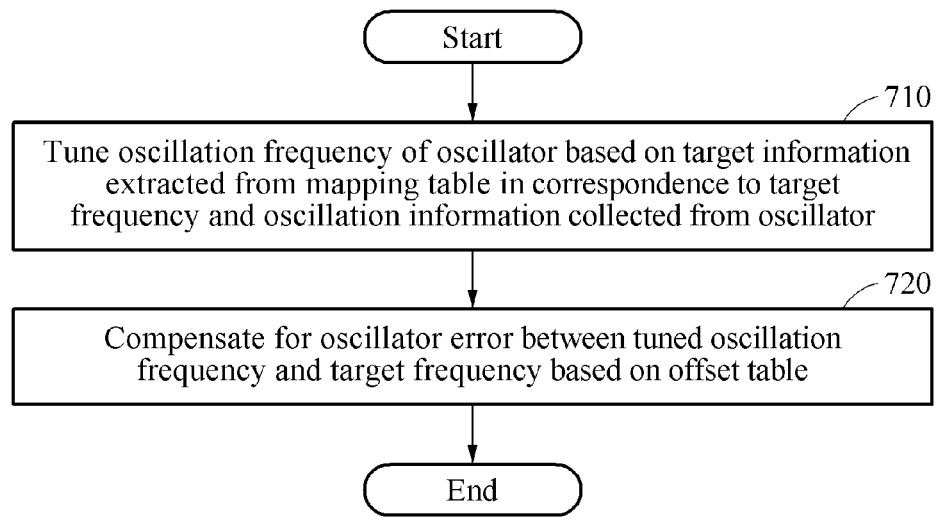
FIG. 7, FIG. 8A, and FIG. 8B illustrate examples of a frequency tuning method.

FIG. 7 is a flowchart illustrating an example of a frequency tuning method. Referring to FIG. 7, in operation 710, a frequency tuner tunes an oscillation frequency of an oscillator based on target information extracted from a mapping table in correspondence to a target frequency and oscillation information collected from the oscillator. The mapping table is a table in which information about the number of oscillations of a corresponding target frequency during a mask time is mapped to each target frequency among a plurality of target frequencies. For example, the target information denotes the number of times that the oscillator is capable of oscillating during the mask time, and the oscillation information denotes the number of times that the oscillator has oscillated during the mask time. The mask time denotes a time in which a mask signal is given and represents a time interval that is used as a standard to count the number of oscillations. A length of the mask time varies based on a desired design.

In one example, the frequency tuner extracts the number of oscillations corresponding to a target frequency of a received signal during a mask time by referring to the mapping table, and compares the extracted number of oscillations of the target frequency to the number of oscillations of the oscillator. If the number of oscillations included in oscillation information is greater than the number of oscillations included in target information, the frequency tuner decreases the oscillation frequency of the oscillator. If the number of oscillations of oscillation information is less than or equal to the number of oscillations included in target information, the frequency tuner increases the oscillation frequency of the oscillator. In this manner, the frequency tuner tunes the oscillation frequency of the oscillator to the target frequency.

In operation 720, a frequency compensator compensates for a compensation error between the tuned oscillation frequency and the target frequency based on an offset table. The offset table represents a table in which a compensation signal for compensating for a compensation error with respect to a corresponding target frequency is mapped to each of a plurality of target frequencies. The compensation error denotes a difference between the target frequency and the oscillation frequency and occurs due to a frequency drift occurring by use of injection current in a quench waveform. The compensation signal denotes a signal for compensating for the compensation error occurring with respect to the target frequency, for example, an instruction signal for tuning a capacitance of the oscillator.

Also, the frequency tuning method may further include generating the mapping table and minimizing the power consumption of the frequency tuner after tuning and compensating for the oscillation frequency.

Figure 8A:
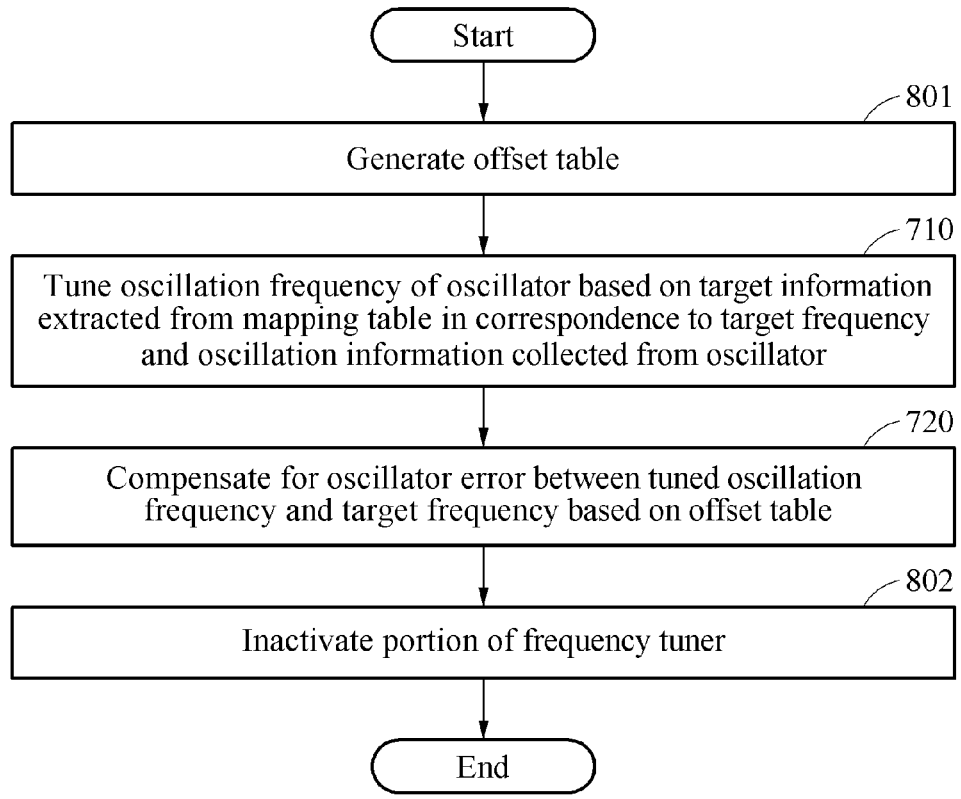

FIG. 8A is a flowchart illustrating a more detailed example of a frequency tuning operation, including an operation of generating the offset table. Referring to FIG. 8A, in operation 801, the frequency tuning apparatus generates the offset table. For example, the frequency tuning apparatus generates the offset table by mapping a compensation signal that minimizes a compensation error for each target frequency. A method of determining the compensation signal that minimizes the oscillation signal will be described with reference to FIGS. 8A and 8B, and FIGS. 9A through 9D. The signal reception apparatus may generate the offset table by measuring a compensation error with respect to each target frequency in real time or at preset intervals, and may also use a pre-stored offset table. When using the pre-stored offset table, the frequency tuning apparatus may save time and power used to adjust an oscillation frequency.

In operation 802, the frequency tuning apparatus inactivates a portion of the frequency tuner once the oscillation signal is compensated for in operation 720. For example, the signal reception apparatus activates the frequency tuner before receiving a data packet, and inactivates at least a portion of the frequency tuner during receiving the data packet. For example, before receiving the data packet or when receiving a beacon, the frequency tuning apparatus activates the frequency tuner through operations 710 and 720, thereby compensating for the compensation error while adjusting the oscillation frequency of the oscillator to the target frequency. During receiving the data packet after the frequency tuning is completed, the frequency tuning apparatus may minimize power consumption by inactivating a portion of the frequency tuner.

Figure 8B:
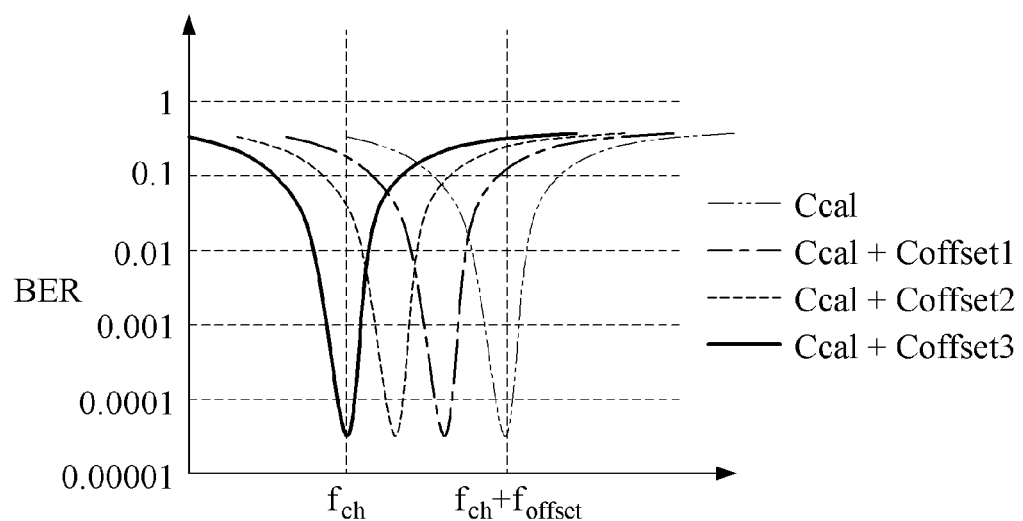

FIG. 8B is a graph showing an example of a BER measured to generate the offset table.

The frequency tuning apparatus generates the offset table by mapping a compensation signal that minimizes a compensation error to each target frequency. In one example, the frequency compensator determines, as a compensation error, a difference between an oscillation frequency of an SRO during a period of time, for example, a calibration mode, in which bias current injected to the SRO is constant before receiving a data packet and an oscillation frequency of the SRO during a period of time, for example, a reception mode, in which current of a quench waveform is injected, with respect to each target frequency, and maps a compensation signal for compensating for the compensation error to the target frequency and stores the mapped compensation signal in the offset table. For example, the frequency tuning apparatus may map the compensation signal that minimizes a BER to each target frequency.

In FIG. 8B, the vertical axis denotes a BER and the horizontal axis denotes an oscillation frequency of the oscillator. For example, with respect to a capacitance Ccal of the oscillator set to oscillate at a specific target frequency $f_{ch}$ in the calibration mode, the frequency tuning apparatus measures the BER by applying a variety of offset capacitances, for example, Coffset1, Coffset2, and Coffset3. The frequency tuning apparatus may control an offset capacitance to change a frequency of the oscillator at which a BER is minimized. If the frequency at which the BER is minimized is the same as or similar to a target frequency at a specific offset capacitance, the frequency tuning apparatus may map, to the target frequency, a compensation signal for controlling the oscillator to have the corresponding specific offset capacitance. Here, the compensation signal may be, for example, a signal for controlling a variable capacitor of the oscillator.

Figure 9:
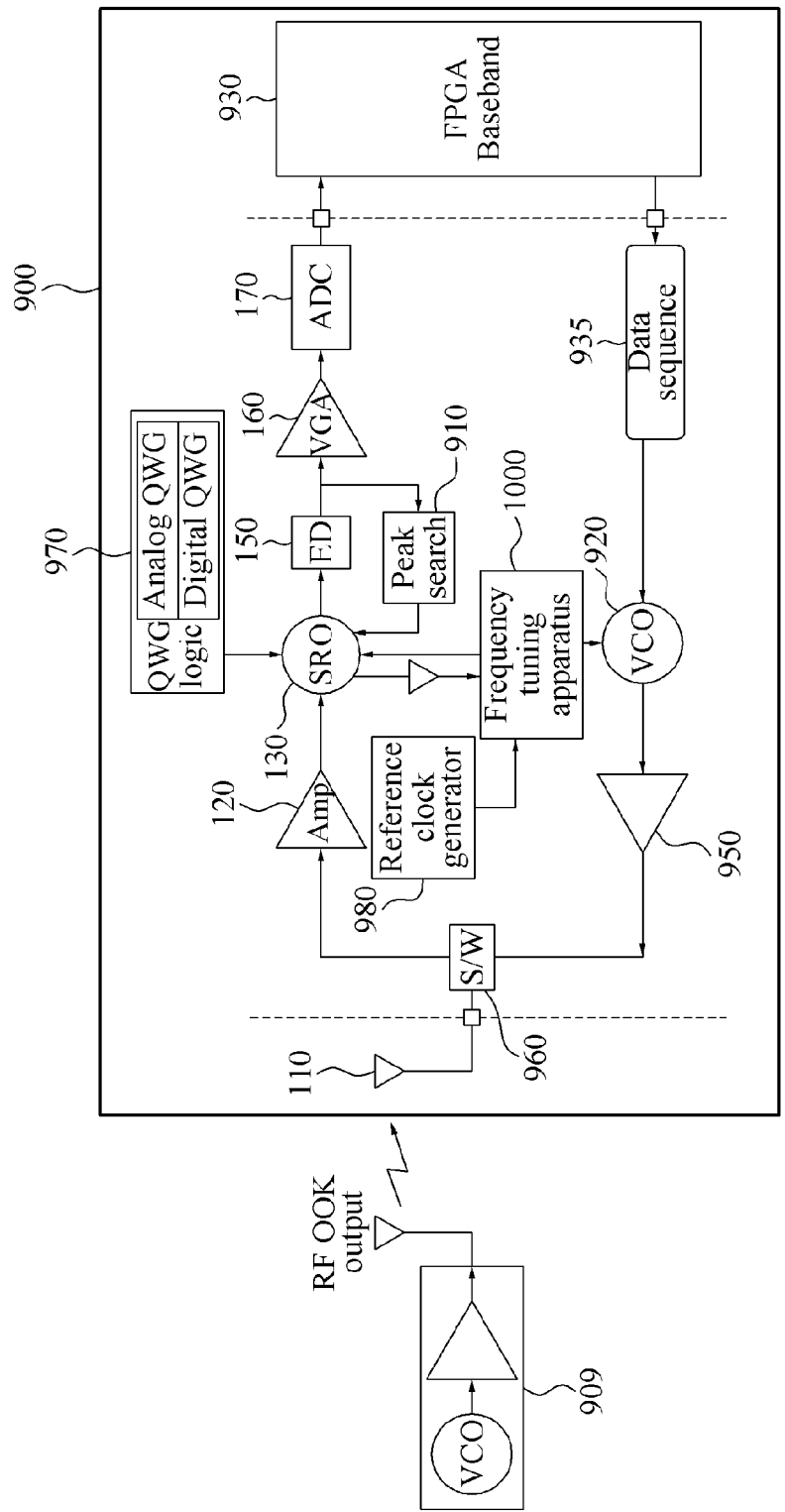
FIG. 9 illustrates an example of a frequency determining process in an SRR.

FIG. 9 illustrates an example of a frequency determining process in an SRR 900. With respect to FIG. 9, when the SRR 900 operates, a transmission signal of a specific target frequency is applied to an antenna 110, and the SRO 130 of the SRR 900 is oscillated by injection locking due to the received signal. The SRR 900 performs envelope detection and analog to digital conversion with respect to an output signal of the SRO 130, and performs symbol detection in a digital baseband, for example, a field programmable gate array (FPGA) baseband 930. For example, the SRR 900 determines an oscillation frequency that is optimal for a transmission signal by determining a capacitance value, for example, a target capacitance, of an LC tank to acquire a resonant frequency indicating a best BER.

In detail, to set a capacitance value, for example, a target capacitance suitable for a channel frequency, the SRR 900 searches for a capacitance value, for example, a target capacitance that maximizes an output of the envelope detector 150 while tuning the capacitance value of the LC tank in a state in which a transmission signal of a desired channel frequency is applied to the SRR 900. As described above, a difference between the capacitance value, for example, a target capacitance, determined to be optimal for the channel frequency and a capacitance value acquired through a digital calibration loop in the calibration mode, for example, during a period of time in which bias current injected to the SRO 130 is constant before receiving a data packet at the target frequency may be an offset capacitance. The offset capacitance denotes a capacitance value for compensating for an offset frequency. The SRR 900 stores the acquired offset capacitance value in the offset table, and performs correction corresponding to the offset capacitance when synthesizing a frequency in the frequency calibration loop. Accordingly, the SRR 900 may prevent an error by the offset frequency and may provide an optimized BER.

A structure in which the SRR 900 applies a transmission signal to acquire an offset capacitance may employ an external transmitter 909 as shown in FIG. 9. The SRR 900 of FIG. 9 includes the antenna 110, the amplifier 120, the SRO 130, the envelope detector 150, the voltage gain amplifier 160, and the ADC 170 of FIG. 1, and a frequency tuning apparatus 1000. The SRR 900 further includes a peak search 910, a voltage controlled oscillator (VCO) 920, a field programmable gate array (FPGA) baseband 930, an amplifier 950, a switch 960, a quench wave generation (QWG) logic 970, a reference clock generator 980, and the like.

The SRR 900 receives a radio frequency on-off keying (RF OOK) output as a transmission signal through the external transmitter 909.

The peak search apparatus 910 detects an output peak of the SRO 130 to evaluate a level at which a frequency of the SRO 130 is tuned over a carrier frequency applied to an end of the antenna 110. The peak search apparatus 910 evaluates that a level of frequency alignment of the SRO 130 is great over the carrier frequency applied to the end of the antenna 110 according to an increase in a value of the detected output peak. The peak search 910 may change a capacitance value through a binary search and, without being limited thereto, may employ a variety of search methods based on a design.

The VCO 920 generates a carrier of the transmission signal.

The frequency tuning apparatus 1000 tunes and compensates for a frequency of the SRR 900 using a target frequency in the calibration mode and the reception mode. The frequency tuning apparatus 1000 will be described with reference to FIGS. 10 through 18. The frequency tuning apparatus 1000 may be an FCL, rather than a PLL.

A data sequence 935 denotes information bits that are transmitted using the transmission signal. The data sequence 935 may be uncoded bits or coded bits based on the transmission signal.

The FPGA baseband 930 performs symbol detection of the SRR 900, BER measurement, and processing of the information bits of the transmission signal. Also, the FPGA baseband 930 adjusts each block of the SRR 900 through a serial peripheral interface (SPI) control and the like.

The amplifier 950 amplifies an output of the VCO 920.

The switch 960 switches an operation of the antenna 110 between a reception RX and a transmission TX.

The QWG logic 970 generates a quench waveform corresponding to bias current of the SRO 130, and includes, for example, an analog circuit and a digital circuit.

The reference clock generator 980 generates reference clock signals required at the SRR 900 based on a reference clock of a crystal Xtal.

In detail, in FIG. 9, the SRR 900 sets the external transmitter 909 at a target channel frequency and tunes a channel frequency of the SRO 130 through peak detection within the SRR 900. The SRR 900 detects an output peak of the SRO 130 using the envelope detector 150, and performs an algorithm of searching for a maximum output of the SRO 130 based on a capacitance value using the peak search apparatus 910.

Figure 10:
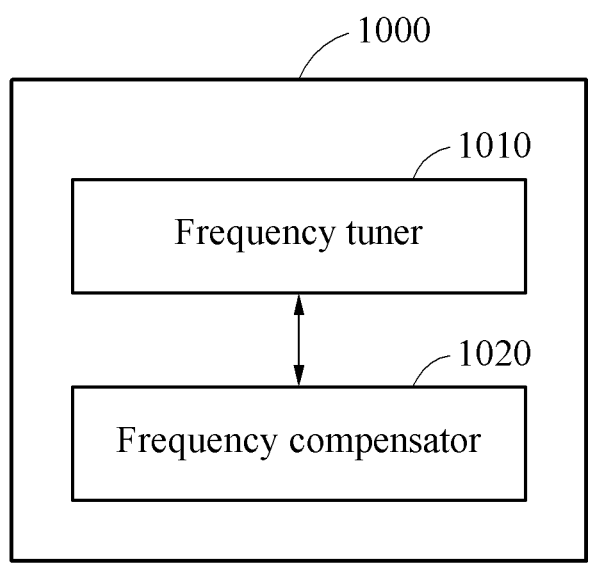
FIG. 10 is a block diagram illustrating an example of a frequency tuning apparatus.

FIG. 10 is a block diagram illustrating an example of a frequency tuning apparatus. Referring to FIG. 10, the frequency tuning apparatus 1000 includes a frequency tuner 1010 and a frequency compensator 1020. The frequency tuning apparatus 1000 is connected to an oscillator to tune an oscillation frequency of the oscillator. For example, the oscillator may include a capacitor of which a capacitance is tunable such that an oscillation frequency of the oscillator is variable. For example, the capacitor included in the oscillator may be configured as a capacitor bank including multiple capacitors, or a metal oxide semiconductor (MOS) varactor. A variety of variable capacitors may be implemented in the oscillator.

The frequency tuner 1010 tunes the oscillation frequency of the oscillator based on target information extracted from a mapping table in correspondence to a target frequency and oscillation information collected from the oscillator. For example, the frequency tuner 1010 compensates for the capacitance of the oscillator based on a compensation signal extracted from an offset table in correspondence to the target frequency. The frequency tuner 1010 controls a portion of the capacitor of the oscillator in response to a control signal for controlling the capacitor of the oscillator. For example, the control signal is generated based on oscillation information and target information and indicates a signal that changes the capacitance so that the oscillation frequency of the oscillator may be changed. Also, in an example in which the capacitor of the oscillator is configured as a capacitor bank including multiple capacitors, the control signal indicates a digital code that instructs an ON/OFF state of each capacitor of the capacitor bank.

The frequency compensator 1020 compensates for a compensation error between the tuned oscillation frequency and the target frequency based on the offset table. For example, the frequency compensator 1020 controls a remaining portion, for example, a remaining portion excluding the portion controlled by the frequency tuner 1010, of the capacitor, in response to a compensation signal extracted from the offset table in correspondence to the target frequency.

As another example, the frequency compensator 1020 compensates for a control signal for controlling a capacitor of the oscillator based on a compensation signal extracted from the offset table in correspondence to the target frequency. For example, the oscillator may include a capacitor, such as a capacitor bank including capacitors corresponding to the respective bits of the digital code, of which a capacitance is configured to be tunable based on a digital code of a control signal. The frequency compensator 1020 changes the digital code of the control signal based on a compensation signal extracted from the offset table in correspondence to the target frequency. When the oscillator operates based on the digital code of the control signal generated by referring to the mapping table, a compensation error occurs between the oscillation frequency and the target frequency. Thus, the frequency compensator 1020 may remove the compensation error by changing the digital code of the control signal.

The oscillator connected to the frequency tuning apparatus 1000 may oscillate at the oscillation frequency in which the compensation error is compensated for.

Figure 11:
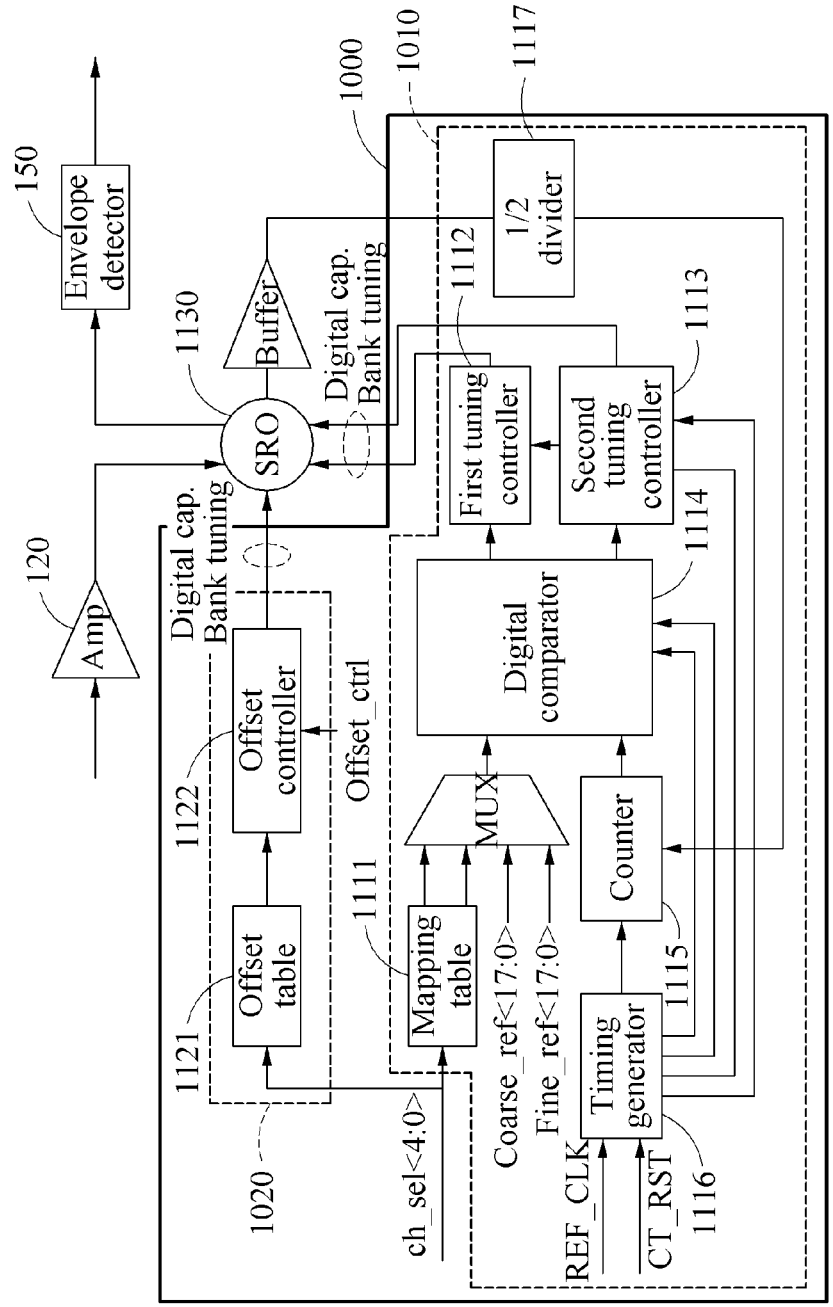
FIG. 11 is a block diagram illustrating another example of a frequency tuning apparatus.

FIG. 11 is a block diagram illustrating an example of the frequency tuning apparatus 1000 included in a signal reception apparatus 1100. Referring to FIG. 11, the frequency tuning apparatus 1000 is connected to an oscillator, for example, an SRO, 1130. The oscillator 1130 oscillates in response to a signal received through the amplifier 120 and transfers an oscillation signal to the envelope detector 150.

The frequency tuning apparatus 1000 includes the frequency tuner 1010 and the frequency compensator 1020 of FIG. 10. The frequency tuner 1010 includes, for example, a mapping table 1111, a first tuning controller 1112, a second tuning controller 1113, a digital comparator 1114, a counter 1115, a timing generator 1116, and a ½ divider 1117.

As described above, the mapping table 1111 may be a table in which information about the number of oscillations of a corresponding target frequency during a mask time is mapped to each target frequency among a plurality of target frequencies. In response to selecting a specific target frequency from a channel section signal, for example, ch_sel<4:0>, the mapping table 1111 provides target information corresponding to the selected target frequency to the digital comparator 1114. In FIG. 11, an output from the mapping table 1111 is converted to oscillation information using a Coarse_ref<17:0> signal and a Fine_ref<17:0> signal at a multiplexer (MUX). However, the foregoing is merely an example of the manner in which oscillation information may be generated.

The first tuning controller 1112 coarsely tunes the oscillation frequency of the oscillator 1130 based on a result of comparing the target information to the oscillation information. In an example in which the capacitor of the oscillator 1130 is configured as a 15-bit capacitor bank, the first tuning controller 1112 may control ON/OFF states of capacitors corresponding to $15^{th}$ to $6^{th}$ bits of a digital code as capacitors corresponding to a coarse portion of a frequency. However, the foregoing is only an example of how the first tuning controller 1112 may coarsely tune the capacitance of the oscillator 1130.

The second tuning controller 1113 finely tunes the oscillation frequency of the oscillator 1130, based on a result of comparing the target information to the oscillation information. In an example in which the capacitor of the oscillator 1130 is configured as a 15-bit capacitor bank, the second tuning controller 1113 may control ON/OFF states of capacitors corresponding to $5^{th}$ to $1^{st}$ bits of the digital code as capacitors corresponding to a fine portion of a frequency. However, the foregoing is only an example of how the second tuning controller 1113 may finely tune the capacitance of the oscillator 1130.

The digital comparator 1114 compares target information to oscillation information and provides a comparison result to the first tuning controller 1112 and the second tuning controller 1113. For example, the digital comparator 1114 may compare a value, for example, the number of oscillations, acquired by counting oscillation signals of the oscillator 1130 during a mask time to the number of oscillations during a mask time corresponding to the target frequency. To this end, the digital comparator 1114 may compare the target information and the oscillation information from a most significant bit (MSB) to a least significant bit (LSB). The digital comparator 1114 outputs a comparison result regarding whether an oscillation frequency of an oscillation signal of the oscillator 1130 is higher or lower than a target frequency, and provides the comparison result to the first tuning controller 1112 and the second tuning controller 1113.

The counter 1115 measures oscillation information about the oscillator 1130 during the mask time. The oscillation information about the oscillator 1130 includes the oscillation frequency of the oscillator 1130 and the number of oscillations of the oscillator 1130 during the mask time. The counter 1115 counts the number of oscillations of the oscillator 1130 during the mask time. For example, the counter 1115 counts divided output signals of the oscillator, for example, signals having passed through a ½ divider 1117 during a preset period of time. The period of time for counting at the counter 1115 may be enabled in response to a MSK_CNT signal of the timing generator 1116. A period of time in which the MSK_CNT signal is applied may correspond to the mask time.

The timing generator 1116 divides a reference frequency, for example, REF_CLK, and provides a timing signal for operating the counter 1115, the digital comparator 1114, the first tuning controller 1112, and the second tuning controller 1113. For example, the timing signal may include RST_CNT, MSK_CNT, EN_COMP, and EN_TUNE.

The ½ divider 1117 divides an output of the oscillator 1130 input to the counter 1115. For example, the ½ divider 1117 may divide the oscillation signal of the oscillator 1130 by 2. The counter 1115 may not normally operate at a high frequency. Thus, a frequency of a signal input to the counter 1115 through the ½ divider 1117 may be reduced. The ½ divider 1117 may also be referred to as a prescaler.

The frequency compensator 1020 includes an offset table 1121 and an offset controller 1122.

The offset table 1121 represents a table in which a compensation signal for compensating for a compensation error occurring with respect to a corresponding target frequency is mapped to each of a plurality of target frequencies, and outputs a compensation signal corresponding to a selected target frequency.

The offset controller 1122 provides the compensation signal for compensating for the compensation error of the oscillator 1130 using the offset table 1121. The offset controller 1122 transfers the compensation signal to the oscillator 1130 according to a specific timing. The offset controller 1122 provides a default signal to the oscillator 1130 in a calibration mode and transfers the compensation signal to the oscillator 1130 in a reception mode. In FIG. 11, an operation of the offset controller 1122 varies based on an Offset_ctrl signal, which will be described with reference to FIG. 13.

Figure 12:
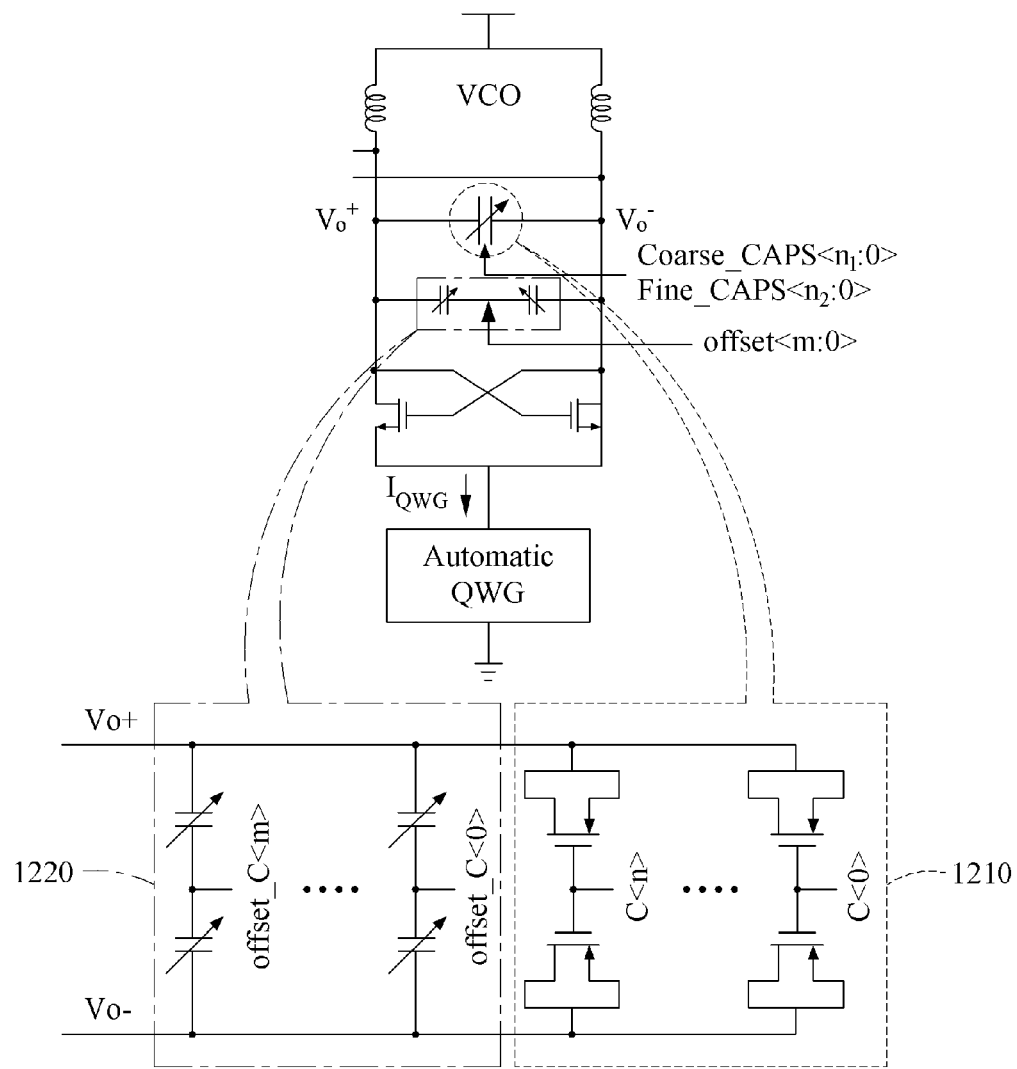
FIG. 12 illustrates an example of an oscillator.

FIG. 12 illustrates an example of the oscillator 1130. Referring to FIG. 12, the oscillator 1130 is, for example, a VCO and includes an inductor to which a quench waveform current $I_{QWG}$ is automatically supplied and having a fixed inductance value, and a capacitor having a tunable capacitor value. The capacitor may be a capacitor bank configured using a plurality of capacitors. For example, some capacitors 1210 included in the capacitor bank are controlled by the frequency tuner 1010 and remaining capacitors 1220 in the capacitor bank are controlled by the frequency compensator 1020. The oscillator 1130 outputs a $V_O^+$ signal and a $V_O^-$ signal as oscillation signals. A structure of a variable capacitor of FIG. 12 is provided as an example only, and a variety of variable capacitors may be applicable to the oscillator 1130.

Capacitances of some capacitors 1210 of the oscillator 1130 are tuned based on a control signal, for example, Coarse_CAPS<$n_1$:0> and Fine_CAPS<$n_2$:0>. Capacitors corresponding to $n_1$+1 bits may be allocated with respect to coarse tuning and capacitors corresponding to $n_2$+1 bits may be allocated to fine tuning. For example, a capacitor corresponding to each bit in a capacitor bank may be in an on or off state based on a digital code, for example, C<0> to C<n>, of the control signal. Here, n=$n_1$+$n_2$+2 and each of n, $n_1$, and $n_2$ denotes an integer greater than or equal to 1. Also, capacitances of the remaining capacitors 1220 of the oscillator 1130 are compensated for based on a compensation signal, for example, Offset<m:0>. Here, m denotes an integer greater than or equal to 1. For example, in response to a digital bit of 1 being applied to Coarse_CAPS<i>, where i denotes an integer between 1 and n, a C<i> capacitor may be activated. Here, it is assumed that capacitors from C<0> to C<$n_1$> are allocated for coarse tuning and capacitors from C<$n_1$+1> to C<n> are allocated for fine tuning. In addition, in response to a digital bit of 1 being applied to offset<j>, where j denotes an integer between 1 and m, an offset_C<j> capacitor may be activated.

Figure 13:
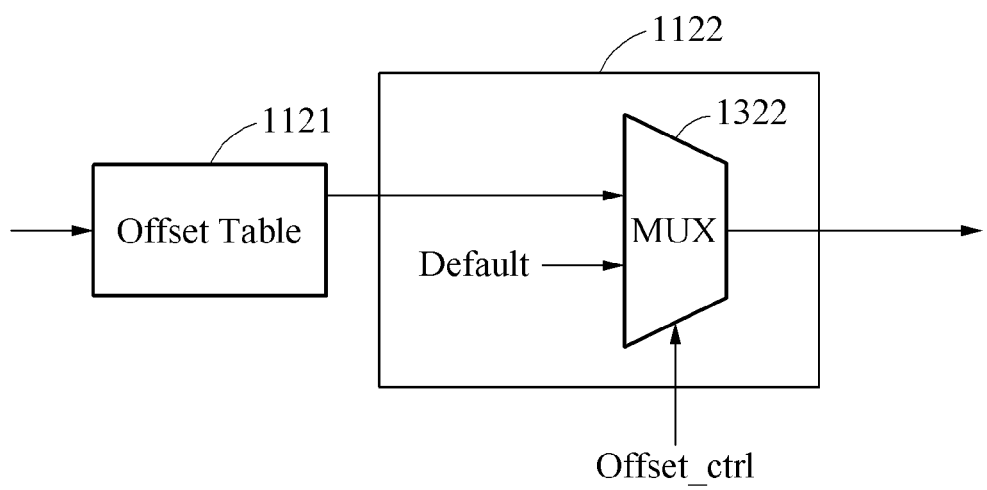
FIG. 13 illustrates an example of a frequency compensator.

FIG. 13 illustrates an example of the frequency compensator 1020. As described above with respect to FIG. 11, the frequency compensator 1020 includes the offset table 1121 and the offset controller 1122. Referring to FIG. 13, the offset controller 1122 provides a compensation signal through a MUX 1322. The offset controller 1122 provides a default signal in a calibration mode in response to an Offset_ctrl signal and provides a compensation signal to an oscillator in a reception mode. In this case, all of the capacitors allocated to the frequency compensator 1020 may be turned ON or OFF.

Figure 14:
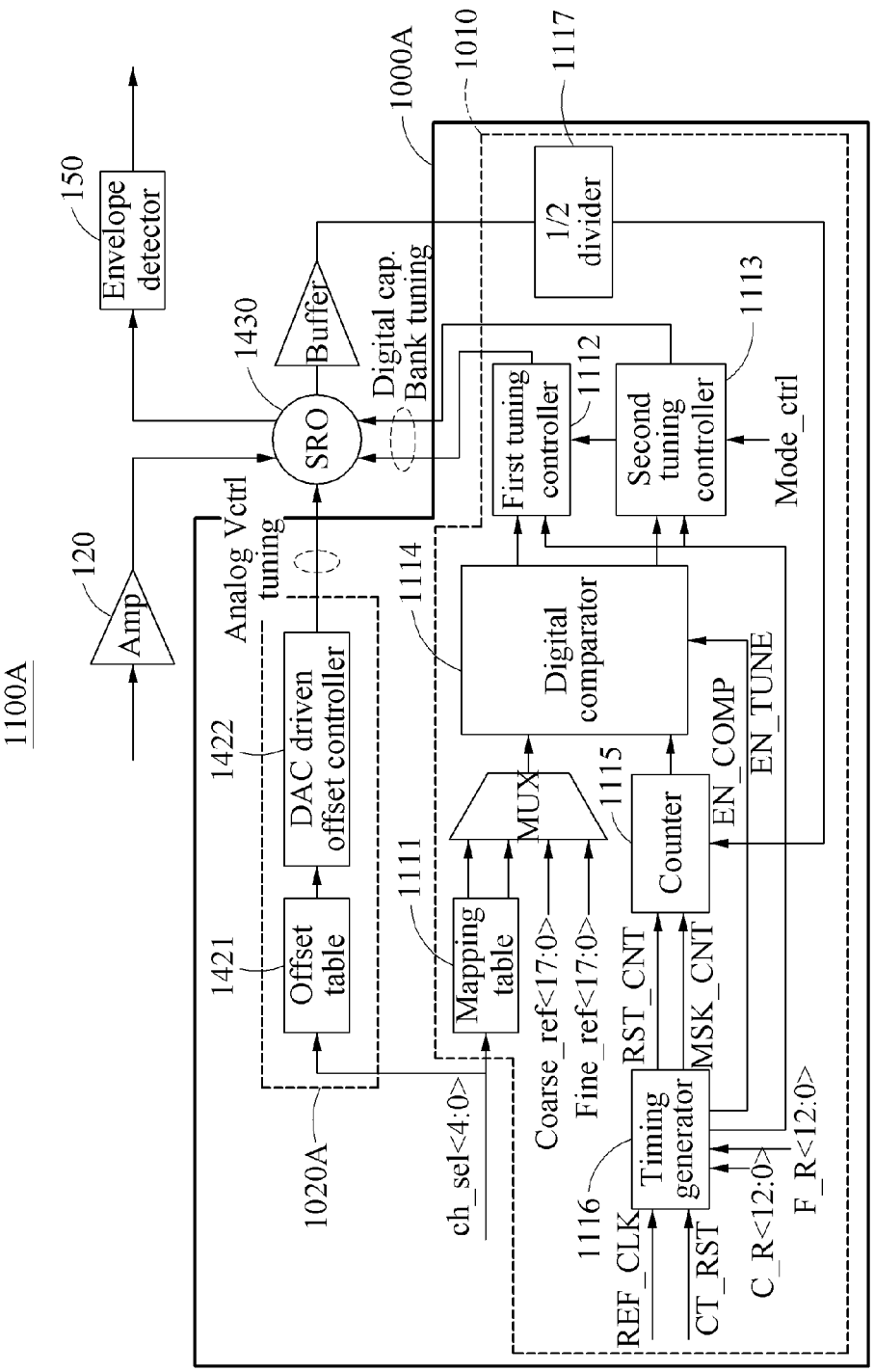
FIG. 14 is a block diagram illustrating another example of a frequency tuning apparatus.

FIG. 14 is a block diagram illustrating another example of a frequency tuning apparatus 1000A in a signal reception apparatus 1100A. Referring to FIG. 14, the frequency tuner 1010 in a similar manner to that described in FIG. 13. The first tuning controller 1112 and the second tuning controller 1113 operate in a calibration mode or in a reception mode in response to a Mode_ctrl signal provided from the timing generator 1116.

The frequency compensator 1020 includes an offset table 1421 and a DAC driven offset controller 1422. An oscillator, for example, an SRO, 1430 includes a first capacitor controlled based on a digital code and a second capacitor controlled based on analog voltage. The first capacitor is tuned by the first tuning controller 1112 and the second tuning controller 1113. The second capacitor is tuned by the DAC driven offset controller 1422.

For example, the offset table 1421 generates a compensation signal corresponding to a selected frequency. The DAC driven offset controller 1422 controls the second capacitor by converting a digital coded compensation signal to analog voltage. The frequency compensator 1020A generates an analog voltage corresponding to a selected target frequency based on the compensation signal and compensates for an oscillation frequency determined by the capacitance of the first capacitor by controlling the capacitance of the second capacitor through the analog voltage.

Figure 15:
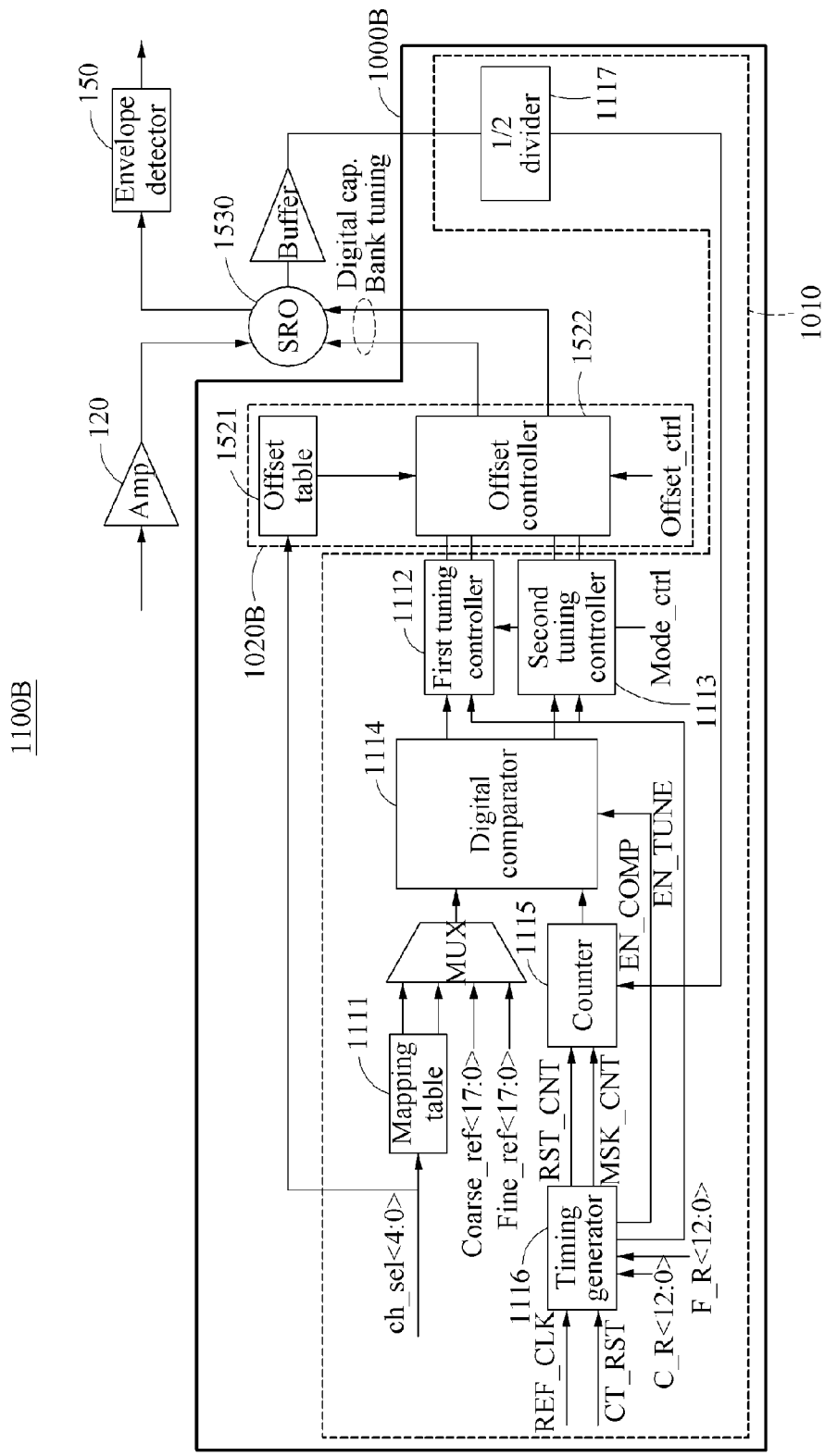
FIG. 15 is a block diagram illustrating another example of a frequency tuning apparatus.

FIG. 15 is a block diagram illustrating another example of a frequency tuning apparatus 1000B included in a signal reception apparatus 1100B. Referring to FIG. 15, the frequency tuner 1010 operates in a similar manner to that described in FIG. 13.

Referring to FIG. 15, the frequency compensator 1020B includes an offset table 1521 and an offset controller 1522, and compensates for a control signal generated at the frequency tuner 1010. For example, the offset table 1521 generates a compensation signal corresponding to a selected frequency, and changes a digital code of a control signal generated at the frequency tuner 1010 based on the generated compensation signal. Here, the offset controller 1522 operates in a calibration mode or a reception mode in response to an Offset_ctrl signal and compensates for the control signal only in the reception mode.

An oscillator, for example, an SRO, 1530 includes a capacitor of which a capacitance is determined based on a digital code of the control signal compensated for based on the compensation signal.

Figure 16A:
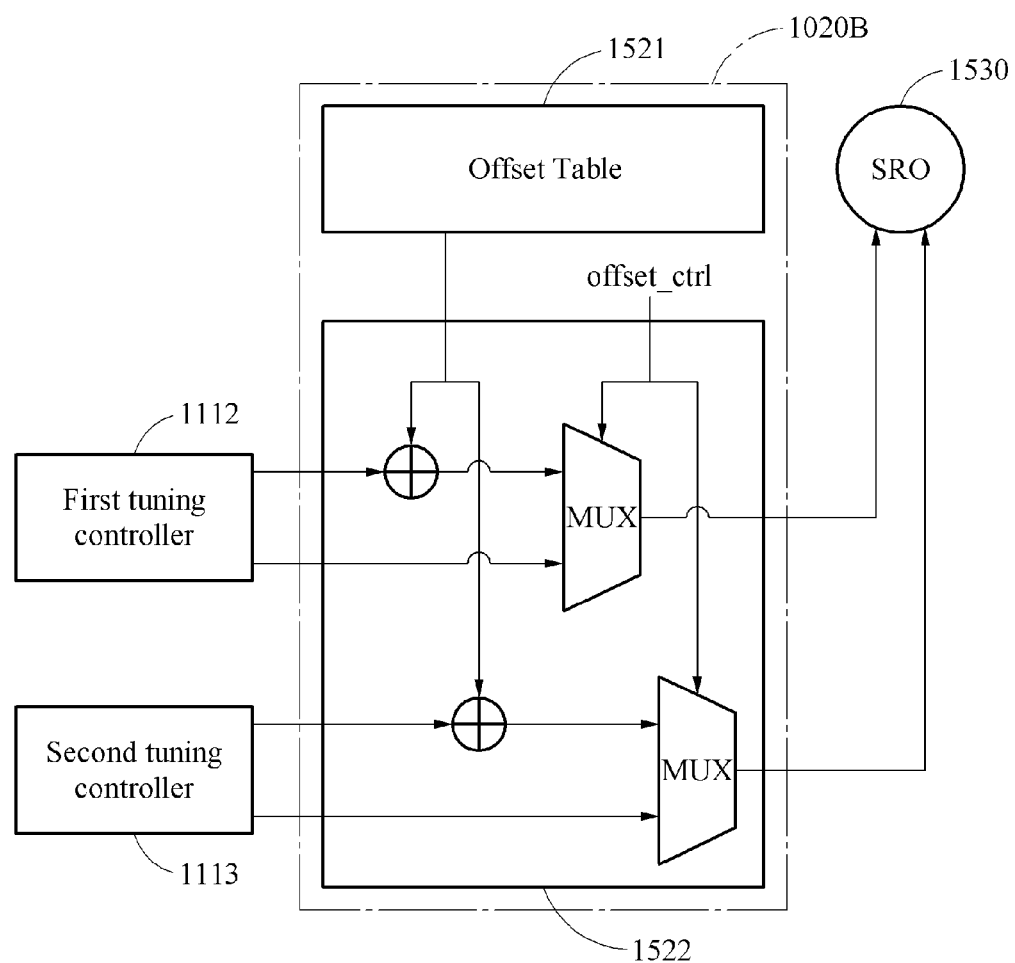
FIGS. 16A through 16C illustrate examples of a frequency compensator of FIG. 15.
Figure 16B:
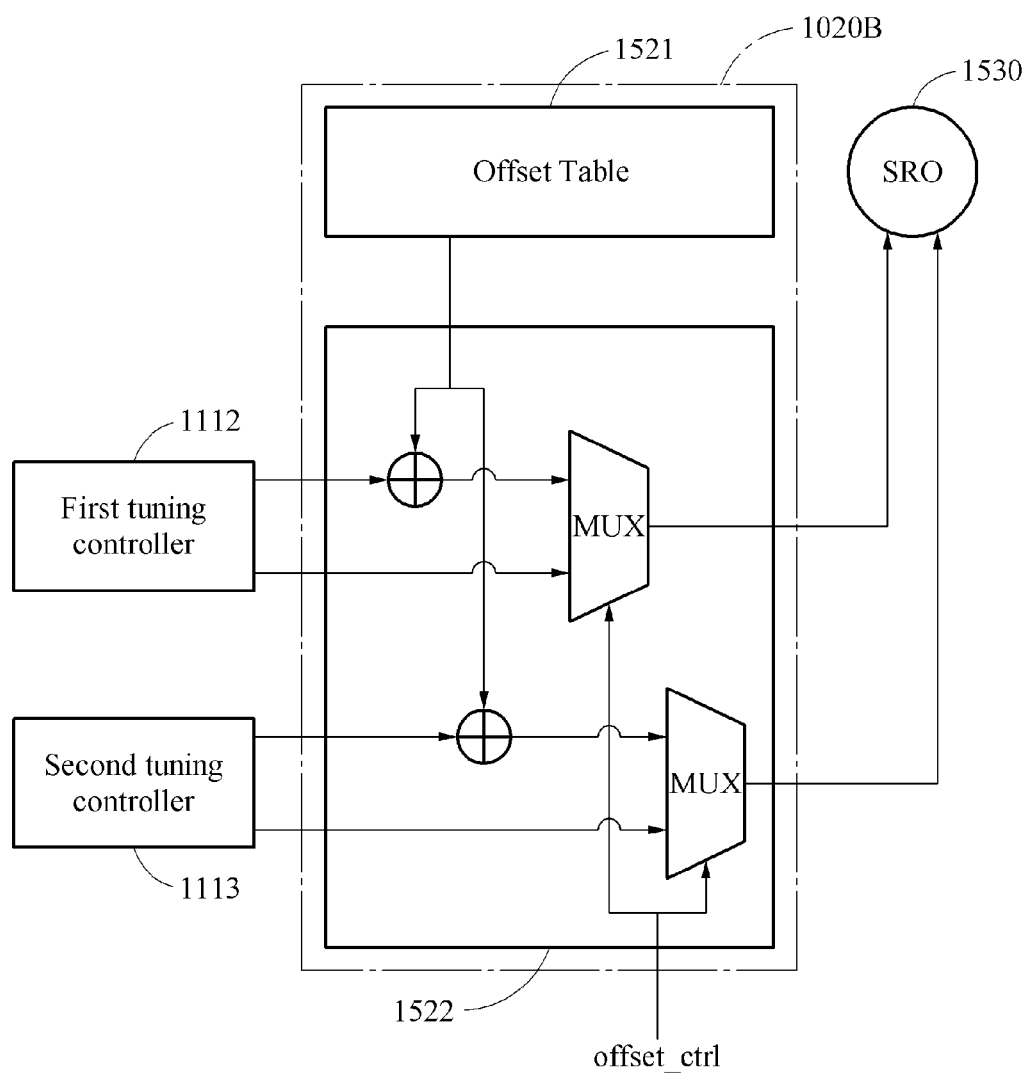
Figure 16C:
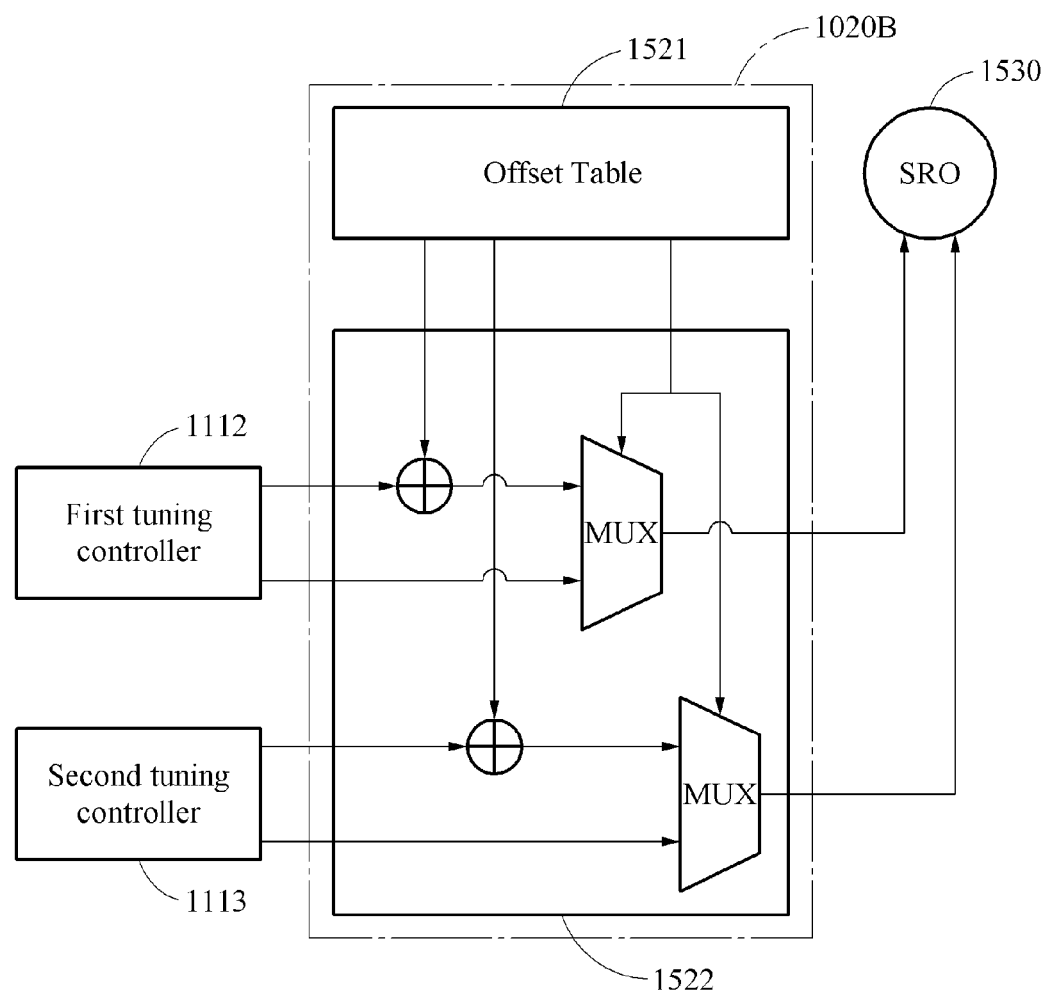

FIGS. 16A through 16C illustrate examples of the frequency compensator 1020B of FIG. 15.

Referring to FIG. 16A, in a reception mode, the offset controller 1522 selects, through a MUX, a signal to which a compensation signal extracted from the offset table 1521 is added to a control signal generated from the first tuning controller 1112 and the second tuning controller 1113 in response to an offset_ctrl signal and transfers the selected signal to the oscillator 1530. In a calibration mode, the control signal generated from the first tuning controller 1112 and the second tuning controller 1113 is immediately transferred to the 1530. The offset_ctrl signal may be generated autonomously at the frequency compensator 1020B.

In FIG. 16B, the offset controller 1522 operates in a similar manner to that described in FIG. 16A, and receives an offset_ctrl signal from an outside of the frequency compensator 1020B, for example, a timing controller or the like. In FIG. 16C, the offset controller 1522 also operates in a similar manner to that described in FIG. 16A. An offset_ctrl signal is generated at the offset table 1521 and is used as a selection signal at the MUX.

Figure 17:
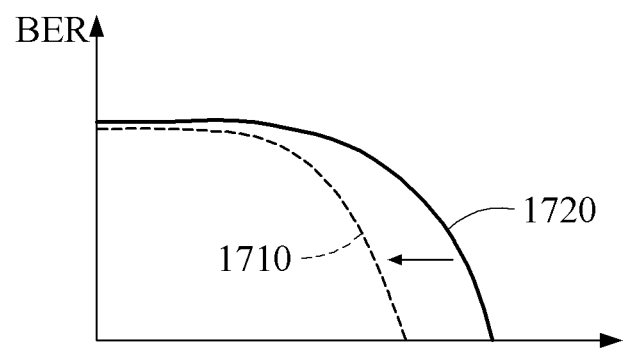
FIGS. 17 and 18 are graphs showing examples of a bit error rate (BER) and a frequency spectrum resulting from applying a frequency tuning apparatus.
Figure 18:
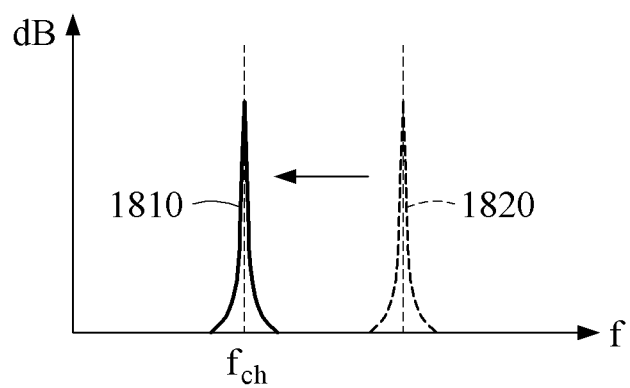

FIGS. 17 and 18 are graphs showing examples of a BER and a frequency spectrum by applying a frequency tuning apparatus according to one or more embodiments disclosed herein. Referring to FIG. 17, a BER 1710 of a signal reception apparatus in which a compensation error is compensated for decreases compared to a BER 1720 of a signal reception apparatus tuned based on a target frequency without compensation. Referring to FIG. 18, a frequency spectrum 1820 including an offset frequency is generated in a signal reception apparatus tuned based on a target frequency without compensation. In contrast, a center frequency of a frequency spectrum 1810 of a signal reception apparatus in which an oscillation signal is compensated for is matched to a target frequency.

In example embodiments disclosed herein, a frequency tuning apparatus may prevent occurrence of an offset frequency and a frequency drift by compensating for a compensation error using an offset table.

The apparatuses, units, modules, devices, and other components illustrated in FIGS. 1 and 9-16C (e.g., the envelope detector 250, the frequency tuning apparatuses 180, 1000, 1000A and 1000B, the FPGA baseband 930, the reference clock generator 980, the frequency tuner 1010, the frequency compensators 1020, 1020A and 1020B, the first and second tuning controllers 1112 and 1113, the digital comparator 1114, the counter 1115, the timing generator 1116, the ½ divider 1117, the offset controllers 1122 and 1522, and the DAC driven offset controller 1422) that perform the operations described herein with respect to FIGS. 7-8B are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 7-8B. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 7-8B that perform the operations described herein with respect to FIGS. 1 and 9-16C are performed by computing hardware, for example, by one or more processors or computers, as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A frequency tuning apparatus comprising:
   a frequency tuner configured to tune an oscillation frequency of an oscillator based on target information extracted from a mapping table in correspondence to a target frequency, and oscillation information collected from the oscillator;
   a frequency compensator configured to compensate for a compensation error between the tuned oscillation frequency and the target frequency based on an offset table; and
   a controller configured to activate the frequency tuner before receiving a data packet, and to inactivate at least a portion of the frequency tuner during receiving the data packet.

2. The frequency tuning apparatus of claim 1, wherein the frequency compensator is further configured to compensate for a capacitance of the oscillator based on a compensation signal extracted from the offset table in correspondence to the target frequency.

3. The frequency tuning apparatus of claim 1, wherein:
the oscillator comprises a capacitor having a capacitance configured to be tuned;
the frequency tuner is further configured to control a portion of the capacitor in response to a control signal for controlling the capacitor; and
the frequency compensator is further configured to control a remaining portion of the capacitor in response to a compensation signal extracted from the offset table in correspondence to the target frequency.

4. The frequency tuning apparatus of claim 1, wherein the frequency compensator is further configured to compensate for a control signal for controlling a capacitor of the oscillator based on a compensation signal extracted from the offset table in correspondence to the target frequency.

5. The frequency tuning apparatus of claim 1, wherein:
the oscillator comprises a capacitor having a capacitance configured to be tuned based on a digital code of a control signal; and
the frequency compensator is further configured to change the digital code of the control signal based on a compensation signal extracted from the offset table in correspondence to the target frequency.

6. The frequency tuning apparatus of claim 1, wherein, in the offset table, compensation signals for compensating for compensation errors occurring with respect to corresponding target frequencies are mapped to the corresponding target frequencies.

7. The frequency tuning apparatus of claim 1, wherein the frequency tuner comprises:
a first tuning controller configured to coarsely tune the oscillation frequency of the oscillator based on a result of comparing the target information to the oscillation information; and
a second tuning controller configured to finely tune the oscillation frequency of the oscillator based on a result of comparing the target information to the oscillation information.

8. The frequency tuning apparatus of claim 1, wherein the oscillator is configured to oscillate at an oscillation frequency in which the compensation error is compensated for.

9. The frequency tuning apparatus of claim 1, wherein, in the mapping table, information about a number of oscillations of corresponding target frequencies during a mask time is mapped to the corresponding target frequencies.

10. The frequency tuning apparatus of claim 1, wherein
in response to a number of oscillations included in the oscillation information being determined to be greater than a number of oscillations included in the target information, the frequency tuner is configured to decrease the oscillation frequency of the oscillator, and
in response to the number of the oscillations of the oscillation information being determined to be less than or equal to the number of the oscillations included in target information, the frequency tuner is configured to increase the oscillation frequency of the oscillator.

11. A frequency tuning apparatus comprising:
a frequency tuner configured to tune an oscillation frequency of an oscillator based on target information extracted from a mapping table in correspondence to a target frequency, and oscillation information collected from the oscillator;
a frequency compensator configured to compensate for a compensation error between the tuned oscillation frequency and the target frequency based on an offset table, wherein, in the mapping table, information about a number of oscillations of corresponding target frequencies during a mask time is mapped to the corresponding target frequencies.

12. The frequency tuning apparatus of claim 11, wherein
in response to a number of oscillations included in the oscillation information being determined to be greater than a number of oscillations included in the target information, the frequency tuner is configured to decrease the oscillation frequency of the oscillator, and
in response to the number of the oscillations of the oscillation information being determined to be less than or equal to the number of the oscillations included in target information, the frequency tuner is configured to increase the oscillation frequency of the oscillator.

13. A super regenerative receiver comprising:
a super regenerative oscillator configured to oscillate in response to a received external signal; and
a frequency tuning apparatus configured to
tune an oscillation frequency of the super regenerative oscillator based on oscillation information collected from the super regenerative oscillator, and target information extracted from a mapping table and corresponding to a target frequency, and
compensate for a compensation error between the tuned oscillation frequency and the target frequency based on an offset table,
wherein the super regenerative receiver is configured to activate the frequency tuner before receiving a data packet, and to inactivate at least a portion of the frequency tuner during receiving the data packet.

14. The super regenerative receiver of claim 13, wherein the frequency tuning apparatus comprises:
a frequency tuner configured to tune the oscillation frequency of the super regenerative oscillator; and
a frequency compensator configured to compensate for the compensation error between the tuned oscillation frequency and the target frequency.

15. The super regenerative receiver of claim 13, wherein, in the offset table, compensation signals for compensating for compensation errors occurring with respect to corresponding target frequencies are mapped to the corresponding target frequencies.

16. The super regenerative receiver of claim 13, further comprising:
an isolator configured to electrically isolate the super regenerative oscillator from an antenna for receiving the external signal, receive the external signal from the antenna, and transfer the external signal to the super regenerative oscillator; and
an envelope detector configured to detect an envelope from an oscillation signal of the super regenerative oscillator.

17. The super regenerative receiver of claim 13, wherein the frequency tuning apparatus is further configured to compensate for a capacitance of the super regenerative oscillator based on a compensation signal extracted from the offset table in correspondence to the target frequency.

18. The super regenerative receiver of claim 13, wherein:
the super regenerative oscillator comprises a capacitor having a capacitance configured to be tuned; and
the frequency tuning apparatus is further configured to
control a portion of the capacitor in response to a control signal, and
control a remaining portion of the capacitor in response to a compensation signal extracted from the offset table in correspondence to the target frequency.

19. The super regenerative receiver of claim 13, wherein the frequency tuning apparatus is further configured to compensate for a control signal based on a compensation signal extracted from the offset table in correspondence to the target frequency.

20. The super regenerative receiver of claim 13, wherein:
the super regenerative oscillator comprises a capacitor having a capacitance configured to be tuned based on a digital code of a control signal; and
the frequency tuning apparatus is further configured to change the digital code of the control signal based on a compensation signal extracted from the offset table in correspondence to the target frequency.

21. The super regenerative receiver of claim 13, wherein the frequency tuning apparatus is further configured to:
determine, as the compensation error, a difference between an oscillation frequency of the super regenerative oscillator during a period of time in which bias current injected to the super regenerative oscillator is constant before receiving a data packet and an oscillation frequency of the super regenerative oscillator during a period of time in which current of a quench waveform is injected, with respect to the target frequency; and
map a compensation signal for compensating for the compensation error to the target frequency and to store the mapped compensation signal in the offset table.

22. The super regenerative receiver of claim 21, wherein the transmission signal is a signal received from an external transmitter.

23. The super regenerative receiver of claim 13, wherein the super regenerative receiver is further configured to:
oscillate the super regenerative oscillator in response to a transmission signal of the target frequency, to determine, as a target capacitance, a capacitance that maximizes an output of an envelope detector with changing a capacitance of the super regenerative oscillator;
map, to the target frequency, an offset capacitance that is a difference between the target capacitance and a capacitance during a period of time in which bias current injected to the super regenerative oscillator is constant before receiving a data packet at the target frequency; and
store the mapped offset capacitance in the offset table.

24. The super regenerative receiver of claim 13, wherein
in response to a number of oscillations included in the oscillation information being determined to be greater than a number of oscillations included in the target information, the frequency tuner is configured to decrease the oscillation frequency of the oscillator, and
in response to the number of the oscillations of the oscillation information being determined to be less than or equal to the number of the oscillations included in target information, the frequency tuner is configured to increase the oscillation frequency of the oscillator.

* * * * *